United States Patent [19]
Blount, Jr. et al.

[11] Patent Number: 5,999,059
[45] Date of Patent: Dec. 7, 1999

[54] WIDEBAND CATV AMPLIFIER WITH MICROPROCESSOR-BASED SLOPE AND GAIN CONTROL

[75] Inventors: Richard J. Blount, Jr., Federal Way, Wash.; Leon M. Underkofler, Blanchard, Id.

[73] Assignee: Thomas & Betts International, Inc., Sparks, Nev.

[21] Appl. No.: 09/001,961

[22] Filed: Jan. 2, 1998

[51] Int. Cl.⁶ .................................................... H03G 3/30
[52] U.S. Cl. ........................................ 330/289; 330/284
[58] Field of Search ................... 330/126, 129, 330/144–5, 284, 289

[56] References Cited

U.S. PATENT DOCUMENTS

| | | | |
|---|---|---|---|
| 3,781,703 | 12/1973 | Duty | 330/52 |
| 3,936,599 | 2/1976 | Peil et al. | 178/7.3 DC |
| 4,023,099 | 5/1977 | van Kessel et al. | 324/105 |
| 4,485,349 | 11/1984 | Siegel et al. | 330/289 X |
| 4,939,786 | 7/1990 | McCallum et al. | 455/67 |
| 5,084,791 | 1/1992 | Thanos et al. | 360/77.04 |
| 5,128,813 | 7/1992 | Lee | 360/78.07 |
| 5,144,267 | 9/1992 | West, Jr. | 333/28 R |
| 5,208,854 | 5/1993 | West, Jr. | 380/7 |
| 5,231,660 | 7/1993 | West, Jr. | 380/7 |
| 5,345,504 | 9/1994 | West, Jr. | 380/7 |
| 5,633,582 | 5/1997 | Orndorff et al. | 324/95 |

*Primary Examiner*—Steven J. Mottola
*Attorney, Agent, or Firm*—Weingarten, Schurgin, Gagnebin & Hayes LLP

[57] ABSTRACT

A broadband amplifier has a microcontroller having tables the entries of which correspond to desired variable slope and gain characteristics of the amplifier. The entries in the tables are derived from known temperature characteristics of a specific amplifier/cable combination; multiple tables are used to support multiple different configurations. The microcontroller retrieves values from the tables based on temperature data supplied thereto via a serial bus; these values are output to digital-to-analog converters which generate slope and gain control signals to control slope and gain compensation circuits in a PIN diode attenuator in the amplifier.

11 Claims, 11 Drawing Sheets

WIDEBAND CATV AMPLIFIER WITH MICROPROCESSOR-BASED SLOPE AND GAIN CONTROL

CROSS REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The present invention pertains to wideband amplifiers of the type used in cable television transmission systems, and more particularly to circuits for controlling the gain and slope characteristics of such amplifiers.

A cable television (CATV) system generally has a "cable plant" that distributes broadband television signals originating in a "headend", or transmission station, to downstream subscribers. The cable plant has a number of "trunk" lines to which the headend is connected, and a number of feeder lines connected to the trunk lines fanning out to subscribers over the service area. The cable plant generally employs wideband amplifiers to regenerate the television signals periodically along the length of the trunk and feeder cables, in order to overcome losses in the cables and thereby provide a signal of adequate amplitude and quality to each subscriber.

The transmitted television signals are attenuated, or reduced in amplitude, as they travel through the cable plant. One function of the amplifiers, then, is to restore the signal amplitude to a known desired value. Because the signal attenuation is unknown a priori, the gain of the amplifiers must be adjusted to achieve this known signal amplitude, and thus require a function referred to as "gain control". The attenuation of the signals is also non-linear, i.e., higher-frequency signals tend to be attenuated more than lower-frequency signals. This nonlinear attenuation with frequency is termed "slope". Another function of the amplifiers is to restore the slope of the signals to a known desired value; this function is referred to as "slope control".

One particular cause of gain and slope variations in the cable plant is temperature variations. The attenuation and slope characteristics of transmission cable and amplifier components vary with temperature. However, because it is desirable that CATV systems have predictable operation across a wide operating temperature, compensation circuits are generally used in CATV amplifiers to compensate for such temperature-caused variations, i.e., to keep gain and slope within a much narrower range than would be obtained in an uncompensated system. CATV amplifier compensation circuits have generally been realized with analog components, including at least one component whose temperature-varying characteristics are exploited to counteract the temperature-caused variations in the amplifier slope and gain.

One specific class of CATV amplifier components requiring compensation includes components such as attenuators and equalizers that use devices known as "PIN diodes" (where "PIN" refers to a positive-intrinsic-negative doping profile used in manufacturing the diode). PIN diodes are specially-constructed diodes that operate as current-controlled variable resistors at high frequencies such as that of the television signals encountered in the CATV cable plant. PIN diodes have a non-linear current-versus-forward-resistance characteristic, so that circuits that provide PIN diode control current generally must operate in a corresponding non-linear fashion in order to achieve the desirable linearization of either slope or gain over an operating temperature range. Prior circuits have been limited in their ability to fully compensate for slope and gain across a broad temperature range. Also, prior circuits have generally been specially tailored for use in specific cable/amplifier configurations, and thus have not generally been usable for different cable/amplifier configurations.

BRIEF SUMMARY OF THE INVENTION

A broadband amplifier having variable slope and gain according to entries in look-up tables in a microcontroller is disclosed. The entries in a given table are derived from known temperature characteristics of a specific amplifier/cable combination; multiple tables are used to support multiple different configurations as necessary. The use of look-up tables is especially advantageous in generating the non-linear control signals required to control PIN diode attenuators. It also allows for easier, more cost-effective reconfiguration of the cable plant when necessary. The presence of a serial interface on the microcontroller enhances the flexibility of the amplifier control circuitry, and its adaptability to different applications and configurations.

Other features and advantages of the present invention appear in the detailed description that follows.

BRIEF DESCRIPTION OF THE SEVERAL VIEWS OF THE DRAWING

An embodiment of the invention is described below with reference to the drawing included herewith, in which.

DETAILED DESCRIPTION OF THE INVENTION

Figure 1:
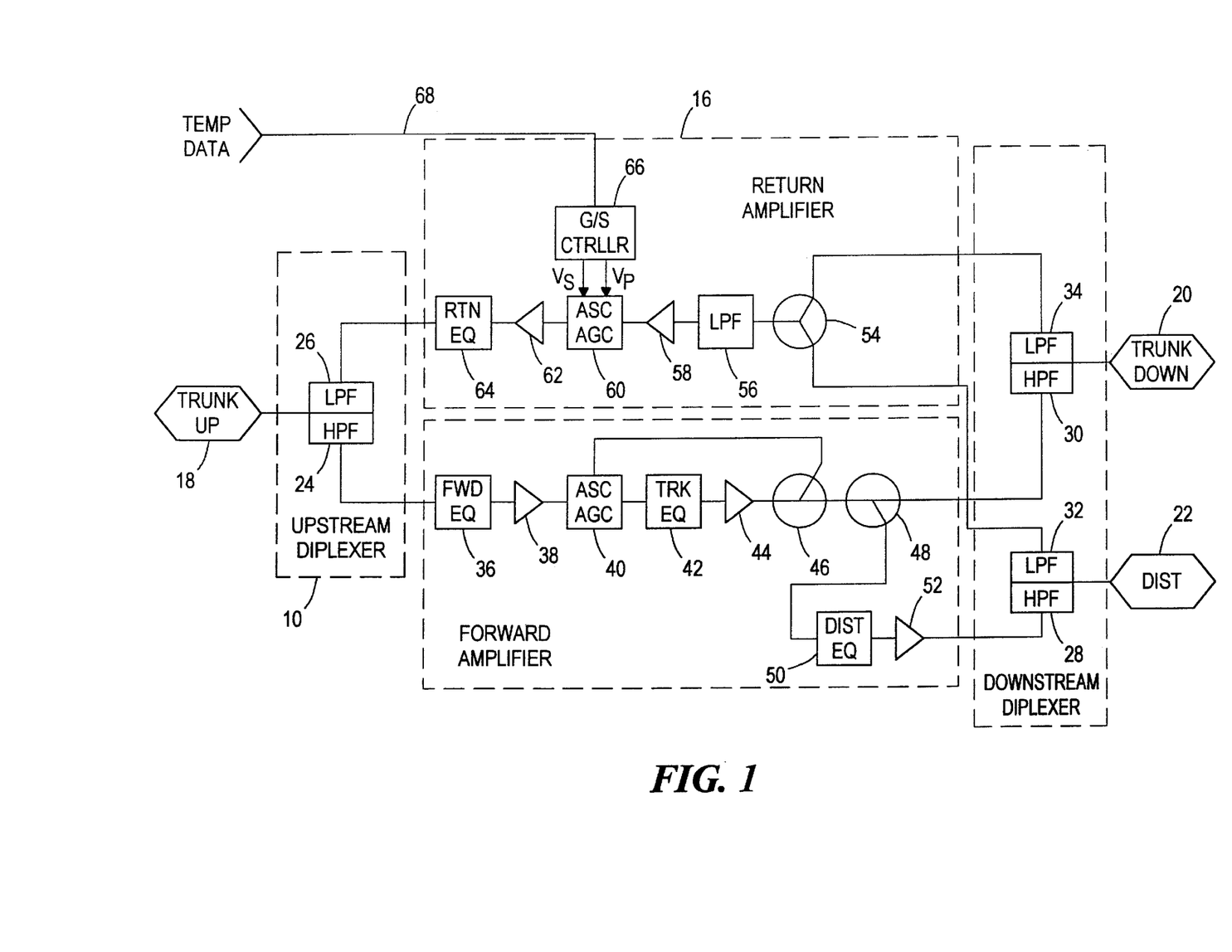
FIG. 1 is a block diagram of an embodiment of a cable television (CATV) amplifier in accordance with the principles of the present invention.

In FIG. 1, a wideband cable television (CATV) amplifier is shown comprising an upstream diplexer 10, a forward amplifier 12, a downstream diplexer 14, and a return amplifier 16. The amplifier has three ports for connection into the CATV cable plant as follows: an upstream trunk port 18, a downstream trunk port 20, and a distribution feeder port 22. The upstream diplexer 10 contains a high pass filter 24 that passes signals occupying a forward band from the upstream trunk port 18 to the forward amplifier 12. The signals in the forward band are in the range of approximately 220–750 Mhz and constitute the signals being broadcast from the headend to the subscribers. A low pass filter 26 is used to couple signals occupying a return band from the return amplifier 16 to the trunk port 18. The signals in the return band are in the range of approximately 5–186 Mhz and constitute the signals being transmitted upstream from the subscribers to the headend.

The downstream diplexer 14 likewise contains two high pass filters 28 and 30, each coupling forward band signals from the forward amplifier 12 to the distribution feeder 22 and downstream trunk 20, respectively. The downstream diplexer 14 also contains two low pass filters 32 and 34 that couple return band signals from the distribution feeder 22 and the downstream trunk 20, respectively, to the return amplifier 16

The forward amplifier 12 comprises a forward equalization circuit 36, and amplifier 38, a slope- and gain-control (ASC/AGC) circuit 40, a trunk equalization circuit 42, a second amplifier 44, signal splitters 46 and 48, a distribution equalization circuit 50, and a third amplifier 52. As shown, one output from signal splitter 46 is fed back to the slope- and gain-control circuit 40. One output from signal splitter 48 is coupled to the downstream diplexer 14 to pass the forward band signals to the downstream trunk 20. The other output from splitter 48 is coupled to the distribution equalizer circuit 50 and eventually to the downstream diplexer 14 to pass the forward band signals to the distribution feeder 22.

The return amplifier 16 contains a signal combiner 54 followed by a low pass filter 56, an amplifier 58, an automatic slope- and gain-control (ASC/AGC) circuit 60, a second amplifier 62, and a return equalization circuit 64. The signals combined by combiner 54 are the return band signals obtained from the low pass filters 32 and 34 in the downstream diplexer 14. The return amplifier 16 also contains a gain/slope controller 66 that provides two signals $V_s$ and $V_p$ to the slope- and gain-control circuit 60. The gain-slope controller 66 has a serial input port coupled to serial bus 68, over which it receives temperature data from a temperature sensor not shown in FIG. 1.

Figure 2:
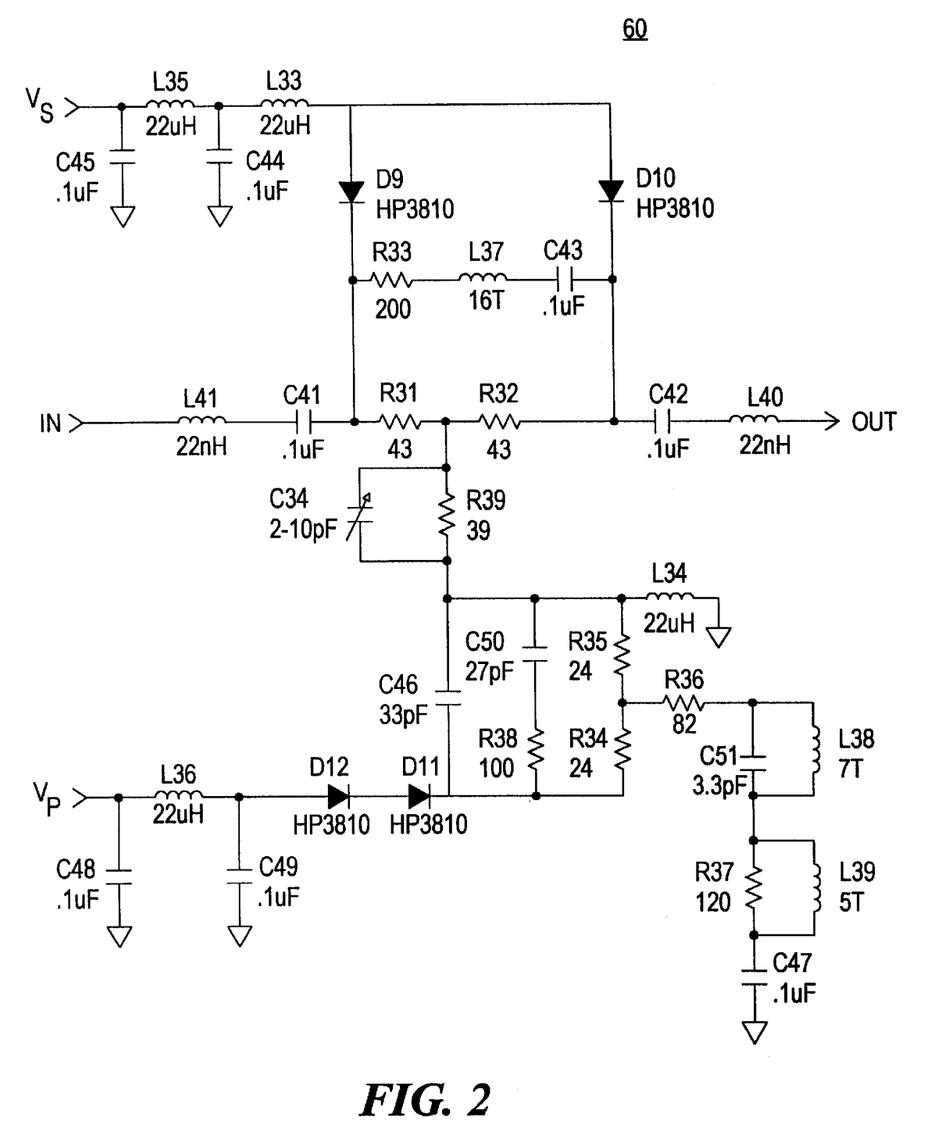
FIG. 2 is a schematic diagram of an attenuator circuit in the CATV amplifier of FIG. 1.

FIG. 2 shows the slope- and gain-control circuit 60 in the return amplifier 16 of FIG. 1. The port labeled "IN" is the output of amplifier 58 in FIG. 1, and the port labeled "OUT" is coupled to the input of amplifier 62 in FIG. 1. The circuit 60 is an attenuator whose slope and gain characteristics are varied in accordance with the input signals $V_s$ and $V_p$. This control is accomplished via PIN diodes D9, D10, D11, and D12 in conjunction with reactive circuit components shown in FIG. 2. FIG. 2 illustrates a common use of PIN diodes as current-controlled variable resistances in high frequency circuits. The anodes of PIN diodes D9 and D10 are DC-coupled to the control signal $V_s$, and the anode of PIN diode D12 is DC-coupled to the control signal $V_p$. The cathodes of diodes D9 and D10 are biased at approximately DC ground, due to low-resistance DC paths through grounded inductor L34, resistor R39, and either of resistors R31 or R32. The cathode of diode D11 is similarly DC-grounded through resistors R34 and R35 and inductor L34. As a result, the signals $V_s$ and $V_p$ directly control the bias of the PIN diodes, and therefore are capable of varying the resistances thereof. The anodes of diodes D9, D10 and D12 are at AC ground potential, and therefore the PIN diodes provide variable AC resistances between AC ground and the nodes to which their cathodes are connected as shown in FIG. 2.

The circuit of FIG. 2 is a modified T attenuator whose primary components are resistors R31, R32, and R39. The circuit consisting of resistor R33, inductor L37 and capacitor C43 is a series reactive impedance in parallel with the top leg of the "T." Similarly the elements C51, L38, R37 and L39 constitute parallel reactive impedances connected in series with the bottom leg of the "T." In the absence of the PIN diodes D9, D10, D11 and D12, these reactive circuits would dictate the slope and gain characteristics of the circuit 60 across the 5–186 Mhz return band. The addition of the PIN diodes D9–D12 and the control signals $V_s$ and $V_p$ enables the circuit characteristics to be changed to achieve improved slope and gain characteristics at various temperatures and for different amplifier/cable configurations.

Figure 3:
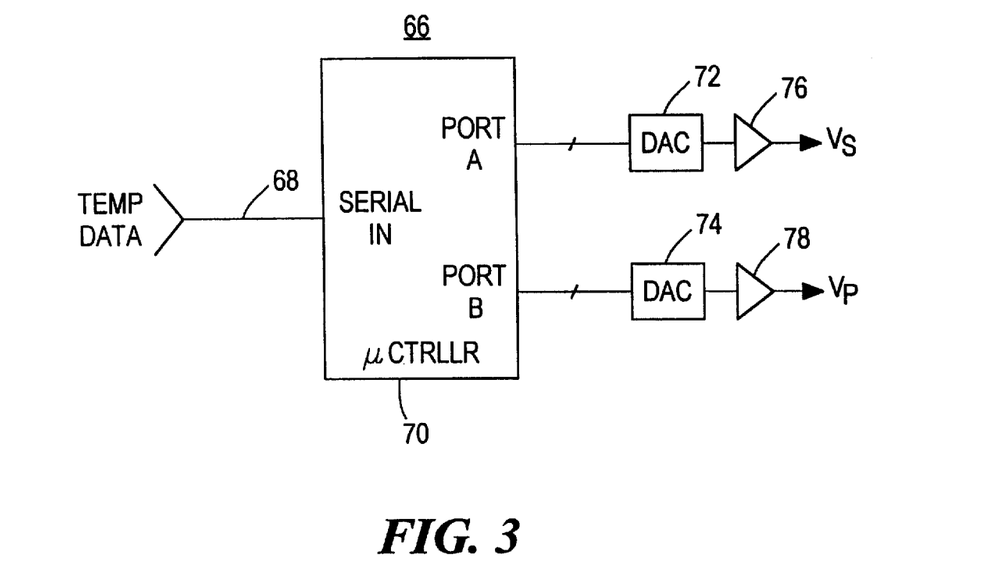
FIG. 3 is a block diagram of a slope/gain controller for the attenuator of FIG. 2.

In FIG. 3, the gain-slope controller 66 of FIG. 1 is shown in greater detail. The primary constituent of the controller 66 is a microcontroller 70 having a serial input 35 port and two parallel output ports. Digital-to-analog converters (DACs) 72 and 74 are used to generate the control signals $V_s$ and $V_p$ through amplifiers 76 and 78. The inputs to the DACs 72 and 74 are the output ports of the microcontroller 70 as shown. As is described in greater detail below, the microcontroller 70 periodically samples the temperature data appearing on serial line 68, and outputs updated values on the output ports. By this configuration, the characteristics of the slope- and gain-control circuit 60 of FIG. 1 are controlled to compensate for temperature-varying characteristics of the return amplifier 16 and a cable attached to the upstream trunk port 18.

Figure 4:
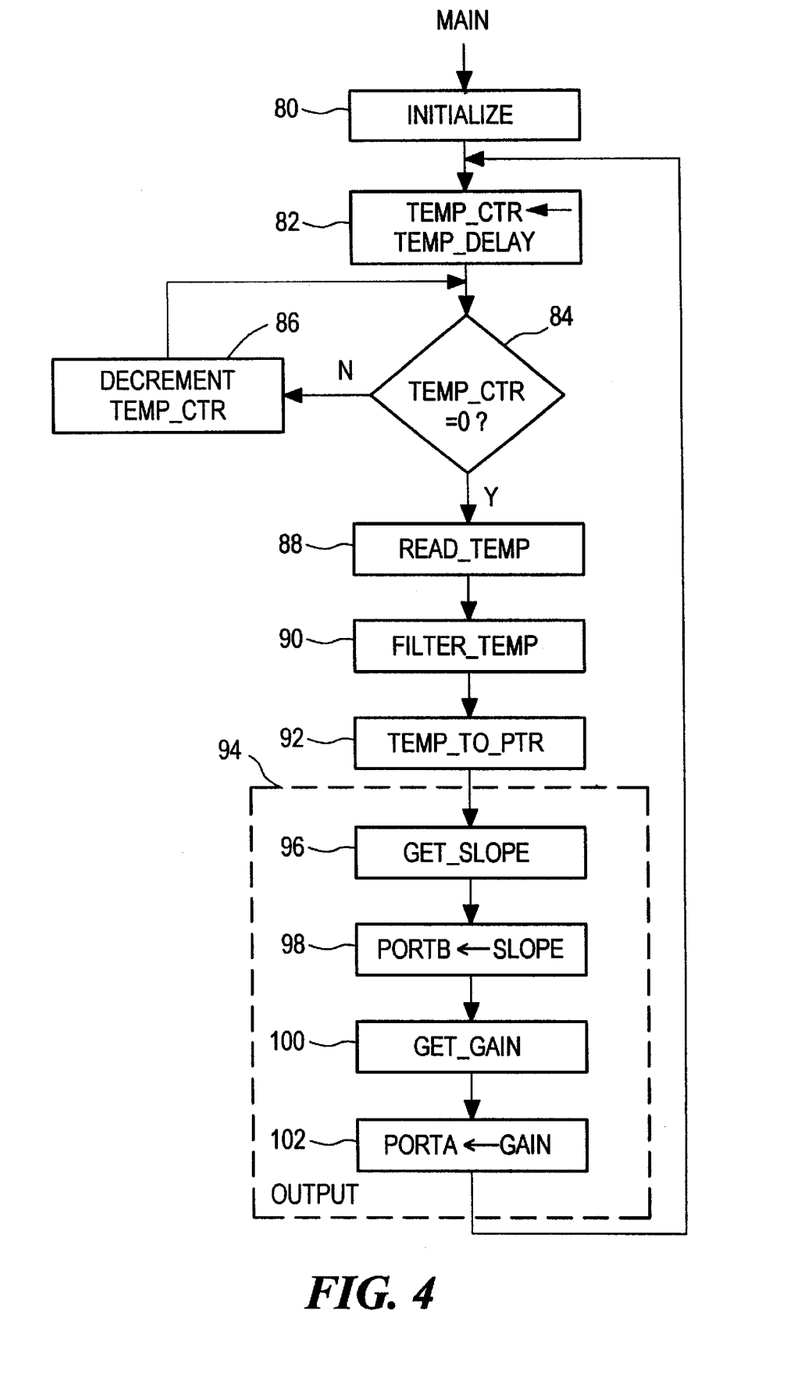
FIG. 4 is a flow diagram of a main slope/gain control routine executed by the controller of FIG. 3.

FIG. 4 illustrates a main firmware routine executed by the microcontroller 70 of FIG. 3. After an initialization step 80, a counter TEMP_CTR is loaded with a value labeled TEMP_DELAY. The routine then remains in a wait loop consisting of steps 84 and 86 until the value of TEMP_CTR has decremented to zero. The value TEMP_DELAY is selected such that the interval between successive iterations of the remaining steps in FIG. 4 is short enough to capture meaningful temperature fluctuations, but long enough to allow the temperature sensor to complete a data conversion cycle.

After the test of step 84 is satisfied, the microcontroller 70 reads temperature data via serial line 68 in step 88. This value is then filtered at step 90 and converted to a pointer at step 92. The process then executes an output routine indicated generally at 94. At step 96, the microcontroller 70 executes a routine called GET_SLOPE, which uses the pointer created in step 92 to access an internal table of slope values to retrieve a slope value corresponding to the pointer. The slope table is described in greater detail below. In step 98, the retrieved slope value is output to port B, after which it is converted to the signal $V_p$ by the DAC 74 and the amplifier 78 of FIG. 3. The process then executes a routine GET_GAIN at step 100 that is analogous to the routine GET_SLOPE. The routine GET_GAIN uses the pointer of step 92 to retrieve a corresponding gain value from an internal gain table. The retrieved gain value is output to port A at step 102, and subsequently becomes control signal $V_s$ via the DAC 72 and the amplifier 76 of FIG. 3. Upon completion of the output routine 94, the counter TEMP_CTR is reloaded again at step 82, and the process is repeated.

Figure 5:
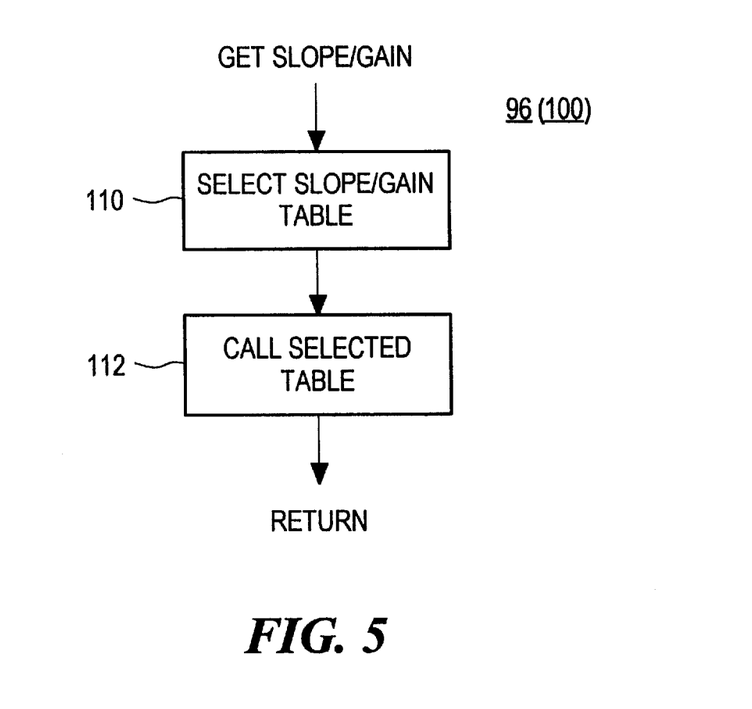
FIG. 5 is a flow diagram describing routines called by the main routine of FIG. 4 for obtaining slope and gain values from slope and gain tables in the controller of FIG. 3.

FIG. 5 illustrates the structure of the GET_SLOPE and GET_GAIN routines 96 and 100. Each routine executes a step 110 that selects one of several slope or gain tables contained by the microcontroller 70. These tables correspond to different configurations of the amplifier as described in greater detail below. After the correct table is selected, the process executes a call to the selected table at step 112, which results in the execution of a return to the output routine 94 of FIG. 4 with the desired slope or gain value. The general structure of the slope and gain tables is shown below:

| Slope Table N | |
|---|---|
| −1: JMP | (PC + PTR) |
| 0: RETURN | (slope value for −54 deg. C.) |
| 1: RETURN | (slope value for −53 deg. C.) |
| ... | ... |
| ... | ... |
| ... | ... |
| 127: RETURN | (slope value for +73 deg. C.) |

| Gain Table N | |
|---|---|
| −1: JMP | (PC + PTR/2) |
| 0: RETURN | (slope value for −54 deg. C.) |
| 1: RETURN | (slope value for −52 deg. C.) |
| ... | ... |
| ... | ... |
| ... | ... |
| 63: RETURN | (slope value for +72 deg. C.) |

Figure 6:
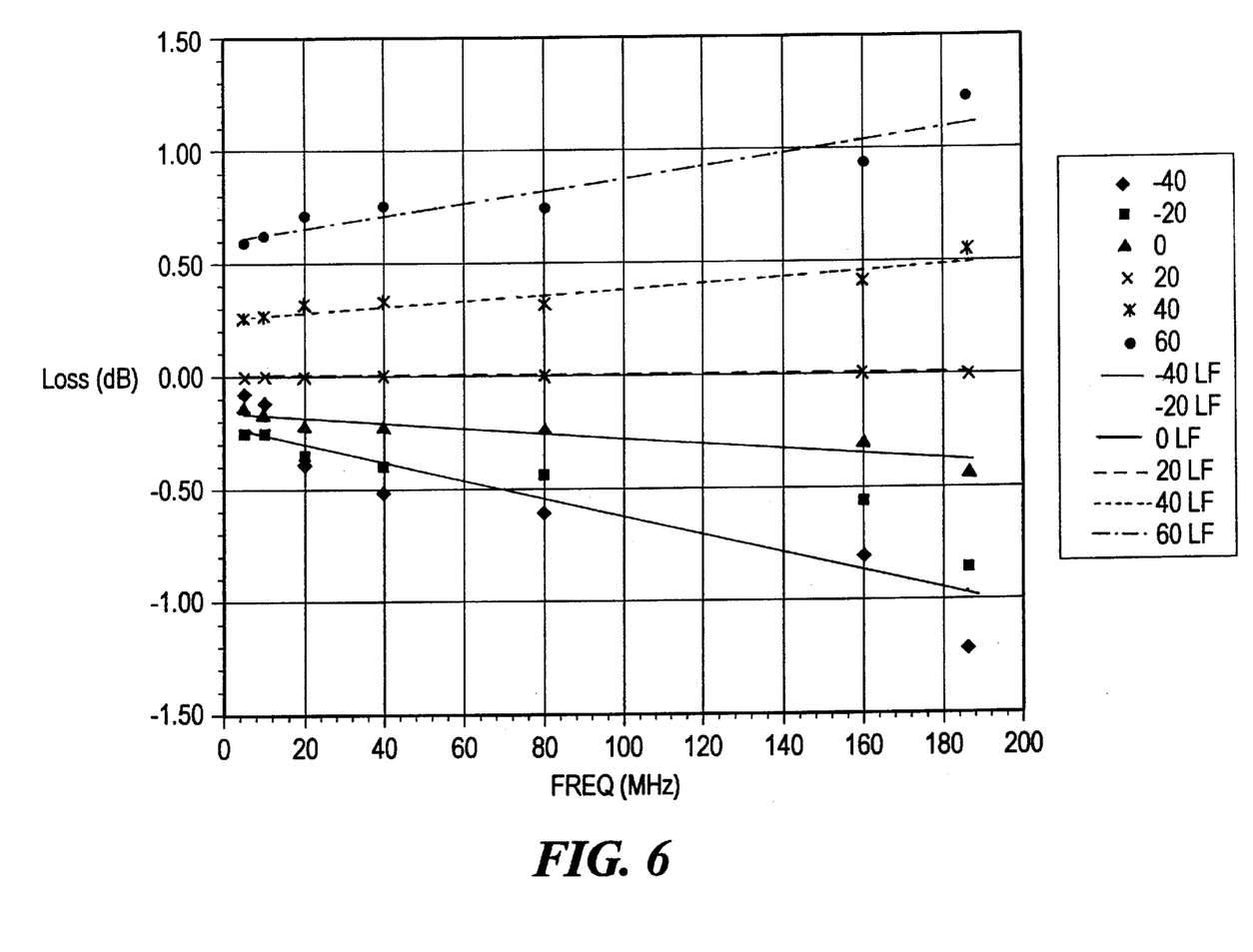
FIG. 6 is a graph of temperature- and frequency-varying gain characteristics of a return amplifier in the CATV amplifier of FIG. 1 in the absence of slope and gain compensation.
Figure 7:
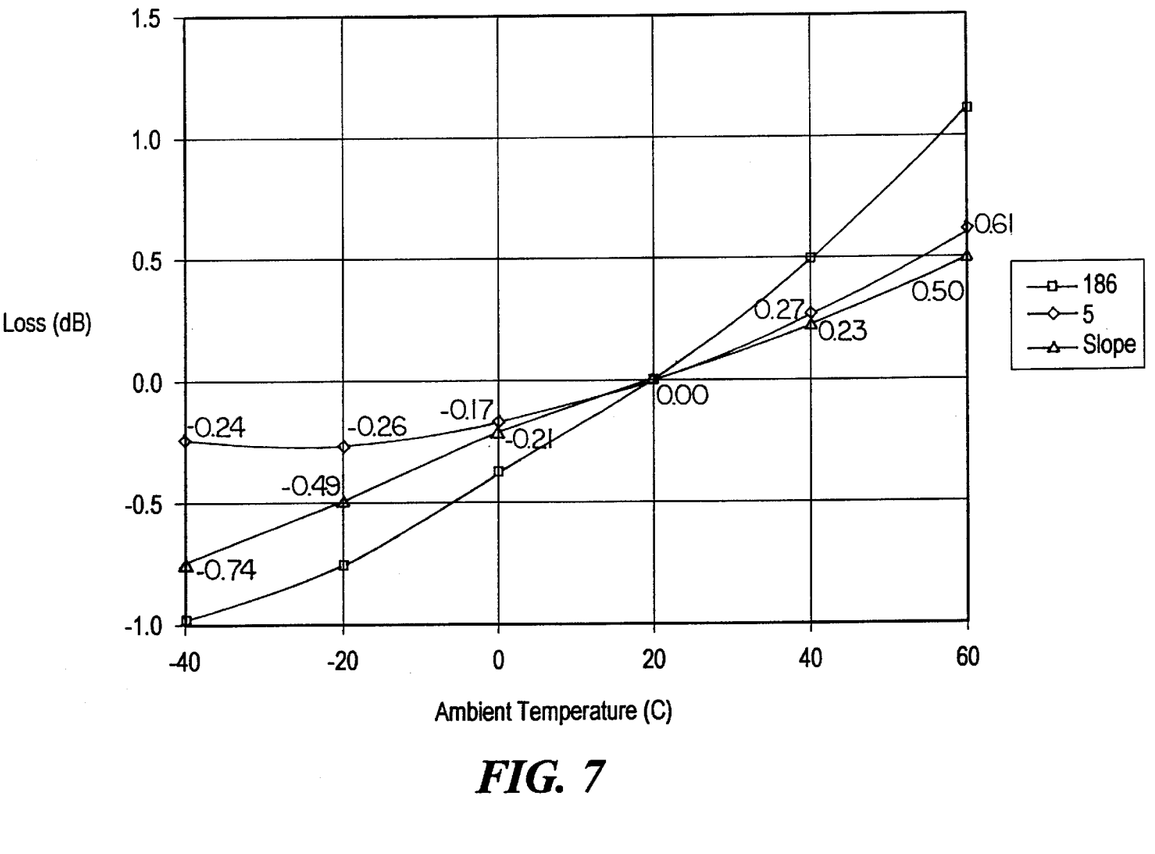
FIGS. 7 through 10 are graphs of temperature-varying slope and gain characteristics for various amplifier/cable configurations with which the attenuator of FIG. 2 and the controller of FIG. 3 may be used.

FIG. 6 shows measured characteristics of the return amplifier 16 without slope and gain compensation across the return band for several temperatures from −40 degrees C. to 60 degrees C. This diagram illustrates the problem of nonlinear gain as a function of frequency for the amplifier 16, especially at low and high temperature extremes. FIG. 7 illustrates this data in a slightly different manner. In FIG. 7, the amplifier gain at 5 Mhz and 186 Mhz are plotted as a function of temperature. Additionally, the slope of the amplifier response at various temperatures is also plotted. This graph illustrates the complex nature of the relationship between gain, slope, and temperature for the amplifier 16 of FIG. 1. The data in FIG. 7 is for the amplifier alone, and does not include any effects of an attached cable.

Figure 8:
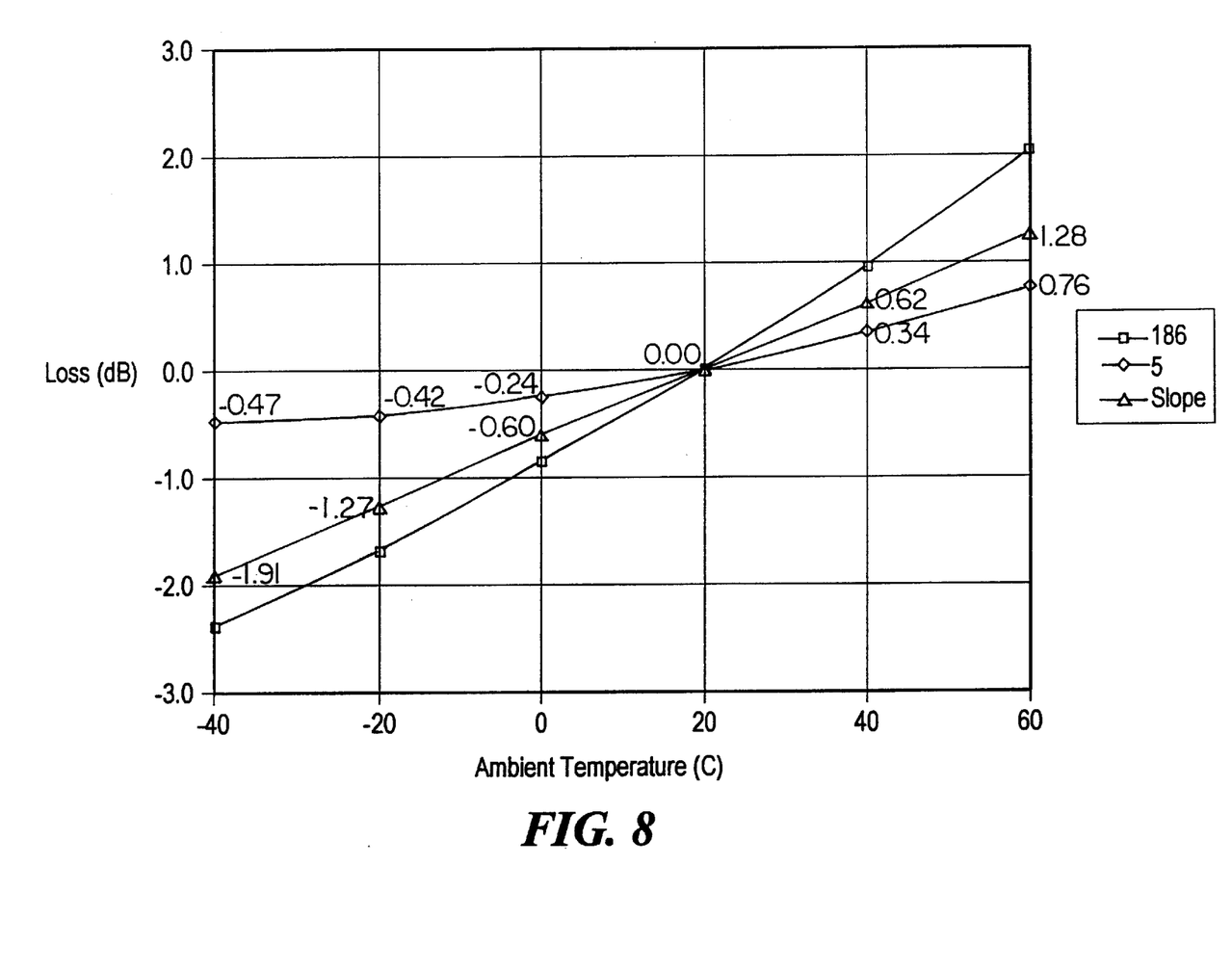
Figure 9:
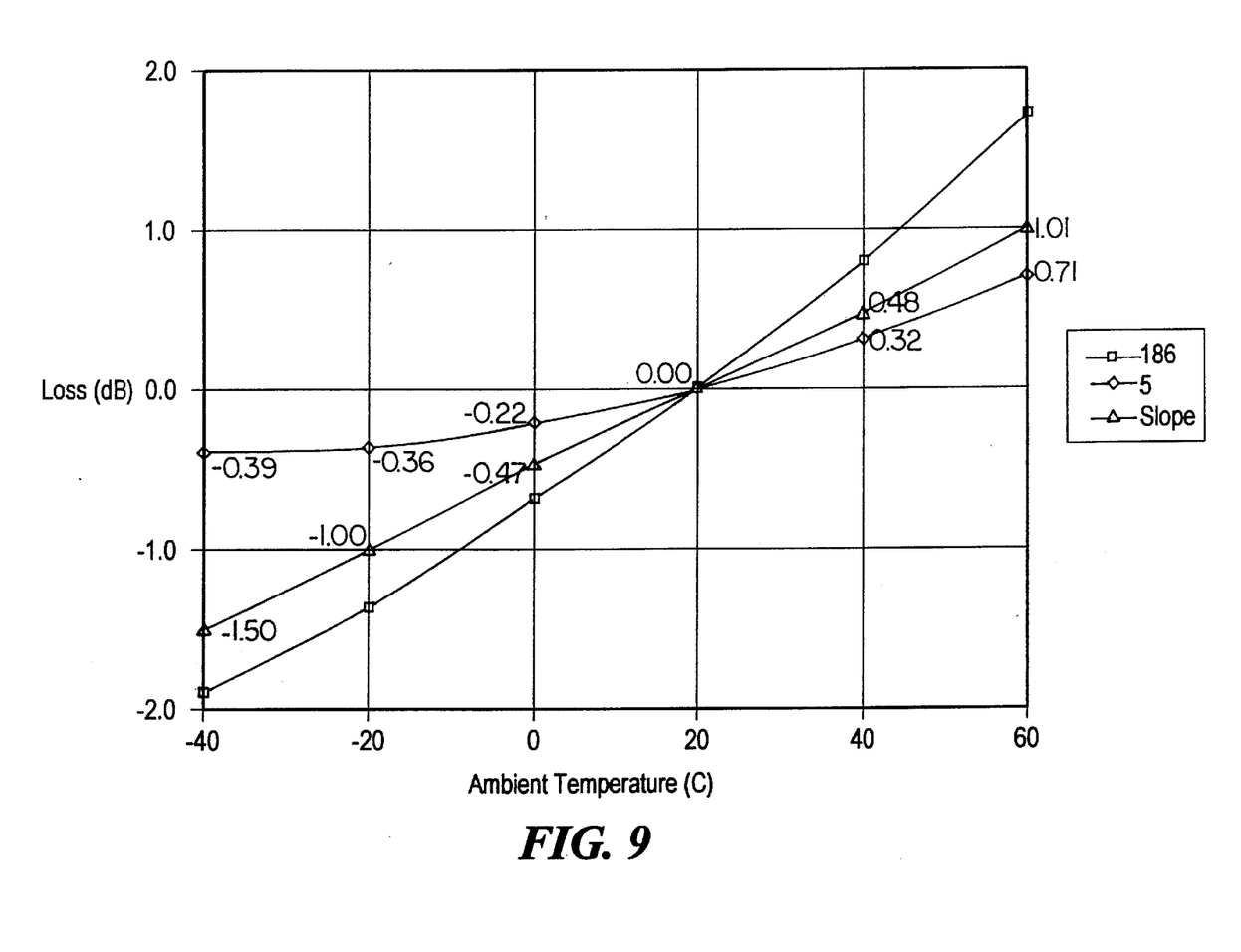
Figure 10:
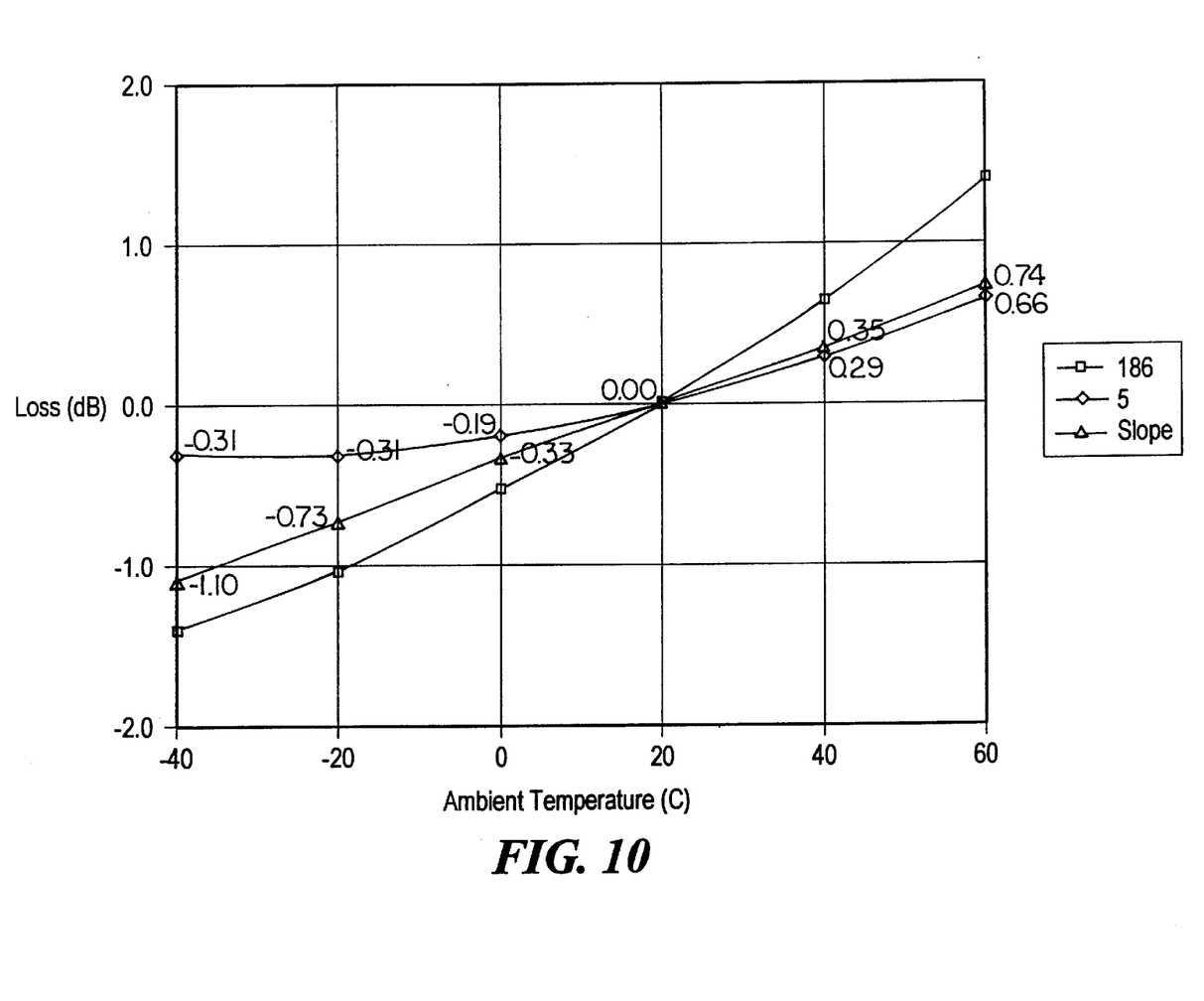

FIGS. 8–10 show plots similar to that of FIG. 7 for different combinations of the amplifier 16 and upstream trunk cables. In FIG. 8, for example, the composite response of a combination of the amplifier 16 and a 26 dB cable length (i.e., a cable length inducing 26 dB of signal attenuation) is plotted. FIGS. 9 and 10 show similar plots for 17-dB and 8-dB cable lengths, respectively.

The response data illustrated in FIGS. 7–10 are used to generate the slope and gain tables contained in the microcontroller 70. The data in the tables represent corresponding values of the signals $V_s$ and $V_p$ that cause the circuit of FIG. 2 to compensate for undesired deviations in the overall response. For example, assuming a combination of the amplifier 16 and a 26-dB cable (FIG. 8), the microcontroller 70 will respond to reading a temperature of −20 degrees C. by outputting slope and gain values that cause the circuit of FIG. 2 to boost the gain by 0.42 dB and correct the slope by 1.27 dB.

Figure 11:
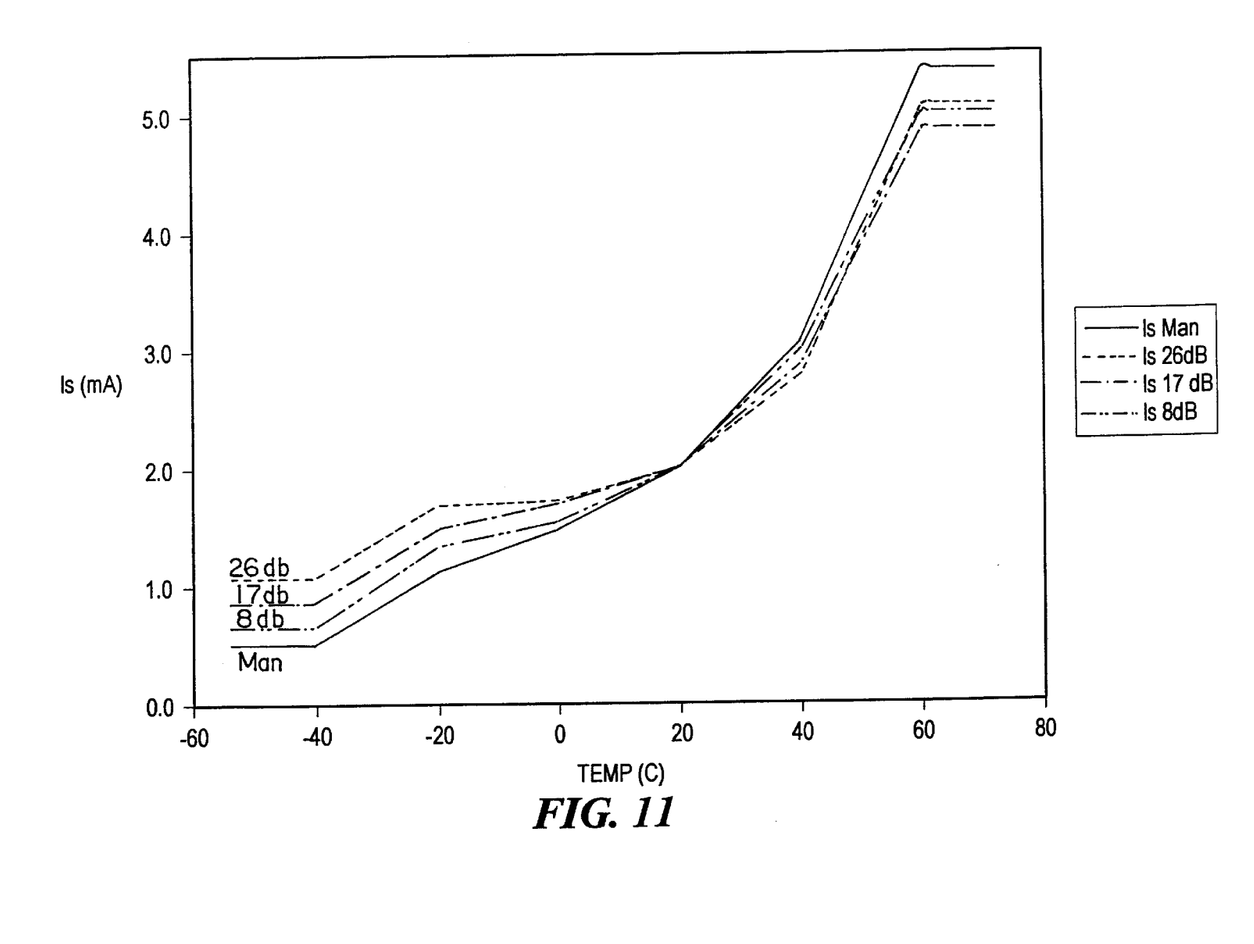
FIGS. 11 and 12 are graphs of PIN diode drive currents required to compensate for gain and slope variation with respect to temperature in the attenuator of FIG. 2.
Figure 12:
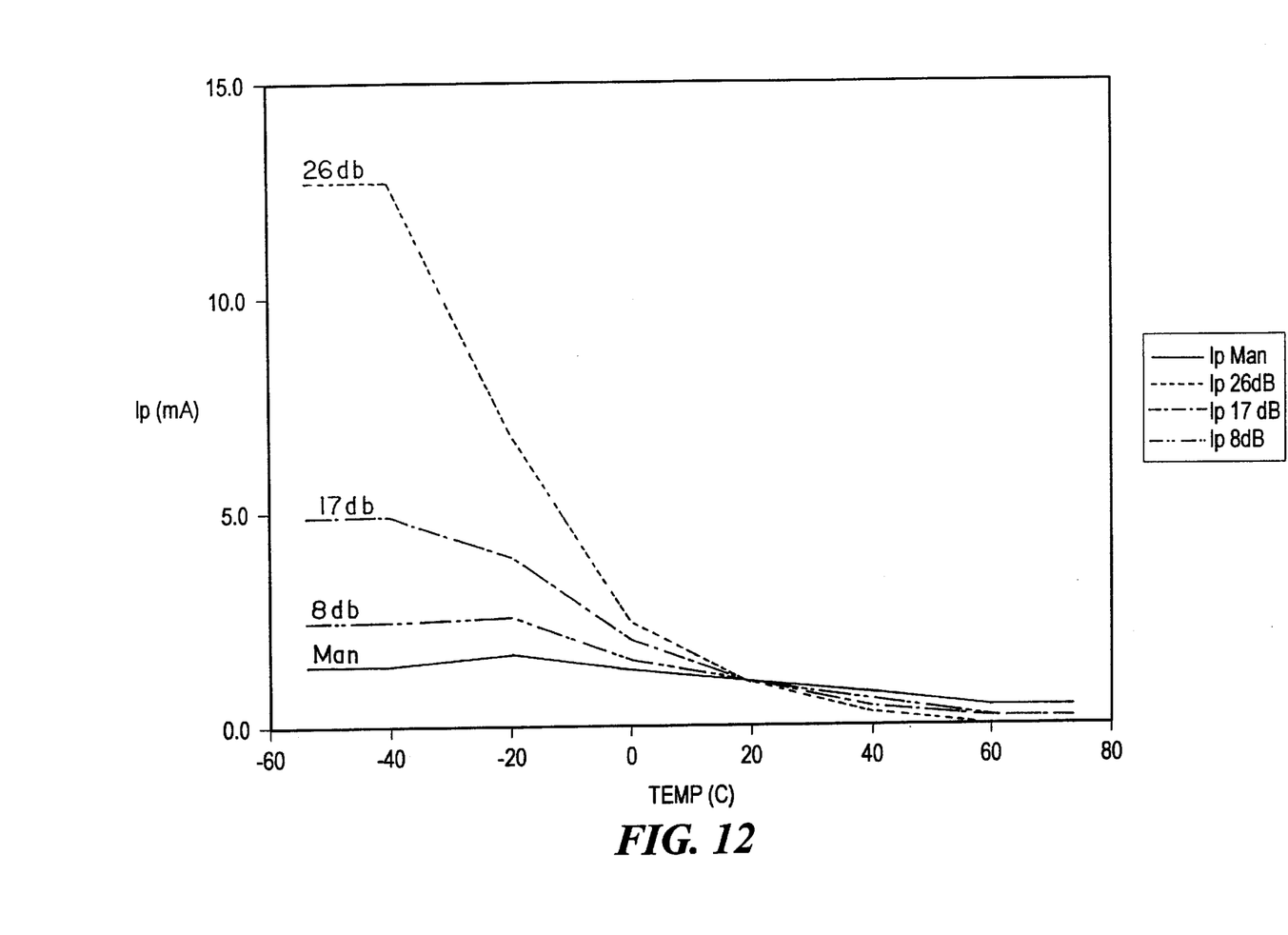

FIGS. 11 and 12 illustrate current-versus-temperature requirements of the PIN diodes D9, D10, D11 and D12 that are also reflected in the gain and slope tables. FIG. 11 shows the current $I_s$ through diodes D11 and D12 that is required to achieve the desired slope compensation for various configurations across the operating temperature range. Likewise, FIG. 12 shows current ($I_p$)-versus-temperature requirements for the parallel combination of diodes D9 and D10.

The slope and gain lookup tables described above are generated in the following general manner. First, the gain and slope characteristics of sample amplifiers (without cable) with respect to temperature are measured. This data is combined with a generally known thermal model of typical trunk coaxial cable of different lengths to obtain composite cable/amplifier thermal models for, for example, 26, 17, and 8 dB of cable. Next, the PIN diode drive currents ($I_s$ and $I_p$) required to produce the same gain and slope changes in the PIN diode control circuit are measured. These are combined to obtain PIN diode drive currents as a function of temperature. The numbers stored in the lookup tables are calculated based the required PIN diode drive current and the voltage-to-current transfer function of the amplifiers 76 and 78 of FIG. 3. Interpolation can be used if it is desirable to control PIN diode drive current at temperature increments that are smaller than the measurement increments.

Attached hereto in an Appendix is a listing of firmware contained in the microcontroller 66 conforming to the description herein. The listing contains additional details of the routines and tables described herein in order to assist in the understanding thereof. The specific data appearing in the tables in the listing correspond to the specific measured amplifier/cable characteristics shown in the Figures. Both the data and the measurements are intended to be exemplary only; the corresponding values in any specific system embodying the present invention will generally be different from those disclosed.

While the foregoing describes an embodiment of the invention for performing temperature-based compensation, the circuitry can be used with minor modifications in other embodiments in which compensation is based on other considerations. One such alternative is circuitry for so-called "closed-loop pilot automatic gain control", an AGC technique used in the CATV industry but traditionally accomplished by other means. In such an application, the input to microcontroller 60 would take the form of a signal indicating the strength of a pilot signal appearing in the CATV signals, and the microcontroller would be programmed to apply slope and gain values appropriate to carry out the AGC algorithm.

It will also be appreciated by those skilled in the art that other modifications to and variations of the disclosed CATV amplifier and gain/slope control circuit are possible without departing from the innovative concepts contained herein. Accordingly the invention herein disclosed is not to be viewed as limited except as by the scope and spirit of the appended claims below.

APPENDIX

```
           00001           TITLE "TASGC FIRMWARE FOR PIC16C62A"
           00002           LIST P = 16c62a, n = 66, r=dec
           00003           ERRORLEVEL -302
           00004    ;** ****************************************************************    **
           00005    ;*-                                                                       -*
           00006    ;*-    TASGC - Thermal Automatic Slop and Gain Compensation               -*
           00007    ;*-                                                                       -*
           00008    ;*- -----------------------------------------------------------           -*
           00009    ;*-                                                                       -*
           00010    ;*-    Author:     Rich Blount                                            -*
           00011    ;*-    Company:    Thomas & Betts Communications Products                 -*
           00012    ;*-    Filename:   tasgc.asm                                              -*
           00013    ;*-    Revision:   6-17-97       ;Begin drafting code                     -*
           00014    ;*-                6-30-97       ;0.01 Simulator - no I2C                 -*
           00015    ;*-                7-3-97        ;0.02 Added I2C routines                 -*
           00016    ;*-                7-30-97       ;0.03 Added PIN tables & test            -*
           00017    ;*-                              ;routines to align PIN ckt               -*
           00018    ;*-                8-20-97       ;0.04 Added 25C offset temp              -*
           00019    ;*-                9-25-97       ;0.05 Updated PIN tables for amp         -*
           00020    ;*-                              ;plus cable                              -*
           00021    ;*-                10-29-97      ;0.06 changed bit test for test/         -*
           00022    ;*-                              ;operate, was test = hi                  -*
           00023    ;*-                12-5-97       ;0.07 toffset was 25 C, is 18 C          -*
           00024    ;*-                12-5-97       ;X1 changed rev for release to           -*
           00025    ;*-                              ;pilot build                             -*
           00026    ;*-                12-16-97      ;X2 Updated Gain & Slope Lookup          -*
           00027    ;*-                              ;Tables based on thermal tests           -*
           00028    ;*-                                                                       -*
           00029    ;*- -----------------------------------------------------------           -*
           00030    ;*-                                                                       -*
           00031    ;*-    TASGC uses a PIC16C62A to convert IIC serial temperature data      -*
           00032    ;*-    to control two PIN diode control currents via a look up table      -*
           00033    ;*-    and two DACs consisting of R2R ladders and transconductance        -*
           00034    ;*-    amplifiers. The IIC temp data and clock are connected to           -*
           00035    ;*-    portC<4:3>. The gain control DAC is connected to portA<5:0>. The   -*
           00036    ;*-    slope control DAC is connected to portB<7:0>. The user selects     -*
           00037    ;*-    either operate or test modes via switches connected to portC<2:0>. -*
           00038    ;*-    Test modes and faults are displayed on LEDs connected to           -*
           00039    ;*-    portC<7:5>.                                                        -*
           00040    ;*-                                                                       -*
           00041    ;** ****************************************************************    **
           00042    ;*-
           00043    ;*-    Get processor SFR definitions
           00044    ;*-
           00045            INCLUDE     <P16C62A.INC>
           00001            LIST
           00002    ;   P16C62A.INC    Standard Header File, Version 1.01    Microchip Technology, Inc.
           00228            LIST
           00046    ;*-
           00047    ;*-    set end of program memory for selected processor
           00048    ;*-
000007FF   00049    PROG_MEM_END        EQU       H'07FF'
           00050    ;*-
           00051    ;*-    Set configuration fuses
           00052    ;*-
2007 3FF7  00053            _FUSES (_BODEN_ON & _CP_OFF & _PWRTE_ON & _WDT_ON & _RC_OSC)
           00054    ;
           00055    ;*-    Conditional assembly equates
           00056    ;
           00057    #define TRUE    1
```

We claim:

1. A circuit, comprising:

a network providing a signal path between an input terminal on which an input signal appears and an output terminal on which an output signal appears;

a PIN diode compensation circuit coupled to the network and having a control input terminal on which a compensation control signal appears, the compensation circuit being responsive to the compensation control signal and interacting with the network to variably compensate for amplitude characteristics in the input signal that are non-linear with respect to frequency;

digital-to-analog converter apparatus for generating the compensation control signal from a multi-bit binary value appearing on the digital inputs thereof; and a microcontroller having an input port and an output port, the output port being coupled to the digital inputs of the DAC, the microcontroller containing a table having entries representing values of the compensation control signal to which the compensation circuit responds by applying compensation to the input signal such that the amplitude characteristics of the output signal are linear with respect to frequency over the operating frequency range of the circuit, the microcontroller being operable to periodically perform the steps of:

retrieving a compensation value from the compensation table in response to data received from the input port indicating which compensation value to retrieve; and outputting the retrieved compensation value to the output port.

2. A circuit according to claim 1, wherein the compensation circuit comprises a positive-intrinsic-negative (PIN) diode coupled between the control terminal and the signal-path-providing network.

3. A circuit according to claim 1, wherein:
the table in the microcontroller is one table from which a compensation value is to be retrieved when the circuit is being used in one configuration;
the microcontroller contains an additional table from which a compensation value is to be retrieved when the circuit is being used in another configuration;
the microcontroller is operable to perform the step of selecting the table corresponding to the configuration in which the circuit is being used, prior to performing the step of retrieving a compensation value; and
the step of retrieving a compensation value comprises the step of retrieving a compensation value from the selected table.

4. A circuit according to claim 1, wherein the digital-to-analog converter apparatus comprises a digital-to-analog converter.

5. A circuit according to claim 1, further comprising a temperature sensor, and wherein:
the input port of the microcontroller is a serial port coupled to the temperature sensor; and
the data received by the microcontroller on the input port is temperature-indicating data received from the temperature sensor.

6. A circuit, comprising:
a network providing a signal path between an input terminal on which an input signal appears and an output terminal on which an output signal appears;
a slope control circuit coupled to the network and having a control input terminal on which a slope-control signal appears, the slope control circuit being responsive to the slope-control signal and interacting with the network to variably compensate for slope in the input signal;
a gain control circuit coupled to the network and having a control input terminal on which a gain-control signal appears, the gain control circuit being responsive to the gain-control signal and interacting with the network to variably compensate for the amplitude of the input signal;
digital-to-analog converter apparatus for generating the slope-control signal and the gain-control signal from corresponding multi-bit binary values appearing on digital inputs thereof; and
a microcontroller having an input port to receive temperature-indicating data and also having two output ports each coupled to the digital inputs of a corresponding one of the DACs, the microcontroller containing a slope table and a gain table each having entries indexed by temperature value, the entries in the tables respectively representing values of the slope-control and gain-control signals to which the slope control and gain control circuits respond by compensating for slope and amplitude of the input signal such that the slope and amplitude of the output signal are maintained substantially constant over the operating temperature range of the circuit, the microcontroller being operable to periodically perform the steps of:
inputting temperature-indicating data from the input port;
retrieving slope and gain values corresponding to the indicated temperature from the slope and gain tables respectively; and
outputting each retrieved value to the corresponding output port.

7. A circuit according to claim 6, wherein the slope and gain control circuits each comprise positive-intrinsic-negative (PIN) diodes coupled between the control terminal and the signal-path-providing network.

8. A circuit according to claim 6, wherein:
(i) the signal-path-providing network comprises two resistors connected in series between the input and output terminals of the circuit;
(ii) the slope-control circuit comprises:
a shunt resistor having one terminal AC-coupled to the common connection of the series-connected resistors;
a first PIN diode the anode of which is DC-coupled to the control terminal of the slope-control circuit;
a second PIN diode the anode of which is coupled to the cathode of the first PIN diode and the cathode of which is DC-coupled to ground and AC-coupled to the other terminal of the shunt resistor;
a parallel reactive circuit AC-coupled between ground and the other terminal of the shunt resistor; and
(iii) the gain-control circuit comprises:
a series reactive circuit AC-coupled in parallel with the two series-connected resistors;
a first PIN diode the anode of which is DC-coupled to the control terminal of the gain-control circuit and the cathode of which is AC-coupled to one end of the series-reactive circuit and DC-coupled to ground; and
a second PIN diode the anode of which is DC-coupled to the control terminal of the gain-control circuit and the cathode of which is AC-coupled to the other end of the series-reactive circuit and DC-coupled to ground.

9. A circuit according to claim 6, wherein:
the slope table and the gain table collectively constitute one pair of slope and gain tables from which slope and gain values are to be retrieved when the circuit is being used with one length of cable;
the microcontroller contains additional pairs of slope and gain tables from which slope and gain values are to be retrieved when the circuit is being used with other lengths of cable;
the microcontroller is operable to perform the step of selecting the pair of slope and gain tables corresponding to the type of cable to which the circuit is connected, prior to performing the step of retrieving slope and gain values; and
the step of retrieving slope and gain values comprises the step of retrieving slope and gain values from the selected pair of slope and gain tables.

10. A circuit according to claim 6, wherein the digital-to-analog converter apparatus comprises two digital-to-analog converters each generating a corresponding one of the slope- and gain-control signals from a corresponding one of the slope and gain values provided thereto by the microcontroller.

11. A circuit according to claim 6, further comprising a temperature sensor, and wherein:
the input port of the microcontroller is a serial port coupled to the temperature sensor; and
the temperature-indicating data is data received by the microcontroller from the temperature sensor.

* * * * *